US011520367B2

(12) United States Patent
Luoto et al.

(10) Patent No.: US 11,520,367 B2
(45) Date of Patent: Dec. 6, 2022

(54) FIRST BATTERY AND SECOND BATTERY CHARGING

(71) Applicant: The Government of the United States, as represented by the Secretary of the Army, Washington, DC (US)

(72) Inventors: Ernest Luoto, Rising Son, MD (US); Brian Frymiare, North East, MD (US); David Carrier, Aberdeen, MD (US)

(73) Assignee: The Government of the United States, as represented by the Secretary of the Army, Washington, DC (US)

( * ) Notice: Subject to any disclaimer, the term of this patent is extended or adjusted under 35 U.S.C. 154(b) by 582 days.

(21) Appl. No.: 15/982,250

(22) Filed: May 17, 2018

(65) Prior Publication Data

US 2019/0356158 A1   Nov. 21, 2019

(51) Int. Cl.
| | | |
|---|---|---|
| *G05F 1/67* | (2006.01) | |
| *H02J 7/35* | (2006.01) | |
| *H01L 31/02* | (2006.01) | |
| *H01M 10/44* | (2006.01) | |
| *H01M 10/42* | (2006.01) | |
| *H02J 7/00* | (2006.01) | |

(52) U.S. Cl.
CPC .......... *G05F 1/67* (2013.01); *H01L 31/02021* (2013.01); *H01M 10/425* (2013.01); *H01M 10/44* (2013.01); *H02J 7/0018* (2013.01); *H02J 7/35* (2013.01); *H01M 2010/4271* (2013.01); *H02J 7/00712* (2020.01); *H02J 2207/10* (2020.01); *H02J 2310/46* (2020.01)

(58) Field of Classification Search
CPC .......... H02J 7/34; H02J 7/0018; H02J 7/0019; H02J 7/0024
USPC .................................................. 320/101, 109
See application file for complete search history.

(56) References Cited

U.S. PATENT DOCUMENTS

| | | | | |
|---|---|---|---|---|
| 5,522,944 A | * | 6/1996 | Elazari .................. | F24D 11/003 136/248 |
| 2003/0044689 A1 | * | 3/2003 | Miyazaki .............. | H02J 7/0022 429/320 |
| 2008/0018297 A1 | * | 1/2008 | Shirai ...................... | H02J 7/35 320/102 |
| 2009/0085520 A1 | * | 4/2009 | Murao .................. | H02J 7/0016 320/134 |
| 2011/0234149 A1 | * | 9/2011 | Hoshi ...................... | B62J 19/00 320/101 |
| 2013/0026989 A1 | * | 1/2013 | Gibbs ...................... | B60L 3/04 320/116 |
| 2017/0008419 A1 | * | 1/2017 | Kim ........................ | B60L 53/22 |

* cited by examiner

Primary Examiner — David V Henze-Gongola
(74) Attorney, Agent, or Firm — Ronald Krosky

(57) ABSTRACT

Various embodiments are described that relate to charging a battery set. The battery set can comprise a first battery and a second battery. The batteries can be alternately charged so they are balanced. In one example, when the first battery is charged, then the second battery is not charged and vice versa. The alternation of charging can be managed based on different criteria, such as timing or charge level.

6 Claims, 11 Drawing Sheets

FIRST BATTERY AND SECOND BATTERY CHARGING

GOVERNMENT INTEREST

The innovation described herein may be manufactured, used, imported, sold, and licensed by or for the Government of the United States of America without the payment of any royalty thereon or therefor.

BACKGROUND

Batteries can store energy to be used at a later time. In one example, an automobile can employ a battery. The automobile can use energy from the battery for a number of tasks. With one example task, the automobile uses battery energy with a starter to start the automobile. After being started, the automobile uses gasoline to produce an energy that not only powers the automobile, but also recharge the battery. However, if the battery loses its charge, then the starter may not be able to function and in turn the automobile will not start. In view of this, it can be important to make sure a battery remains charged.

SUMMARY

In one embodiment, a battery charge management system comprises a selection component and a charge component. The selection component can make a selection of a first battery to charge from a battery bank and a second battery not to charge from the battery bank. The charge component can cause the first battery to be charged while the second battery is not charged as a result of the selection.

In another embodiment, a controller can be configured to be connected to a first battery and a second battery. The controller can comprise a first control component configured to control the first battery to be charged while the second battery is not charged. The controller can also comprise a second control component configured to control the second battery to be charged while the first battery is not charged.

In yet another embodiment, a method can be performed at least in part by a battery management apparatus. The method can comprise identifying a condition to stop charging a first battery and stopping the charge of the first battery in response to identifying the condition to stop charging the first battery. The method can also comprise making a determination on if a second battery should be charged when the first battery is no longer charged and causing the second battery to be charging if the determination is that the second battery should be charged when the first battery is no longer charging.

BRIEF DESCRIPTION OF THE DRAWINGS

Incorporated herein are drawings that constitute a part of the specification and illustrate embodiments of the detailed description. The detailed description will now be described further with reference to the accompanying drawings as follows:

FIG. 1A-1E can be collectively referred to as 'FIG. 1.' Also, individual numbers with designator letters can be collectively referred to by their numbers (e.g., '123A' and '123B' can be referred to as '123').

DETAILED DESCRIPTION

Figure 1A:
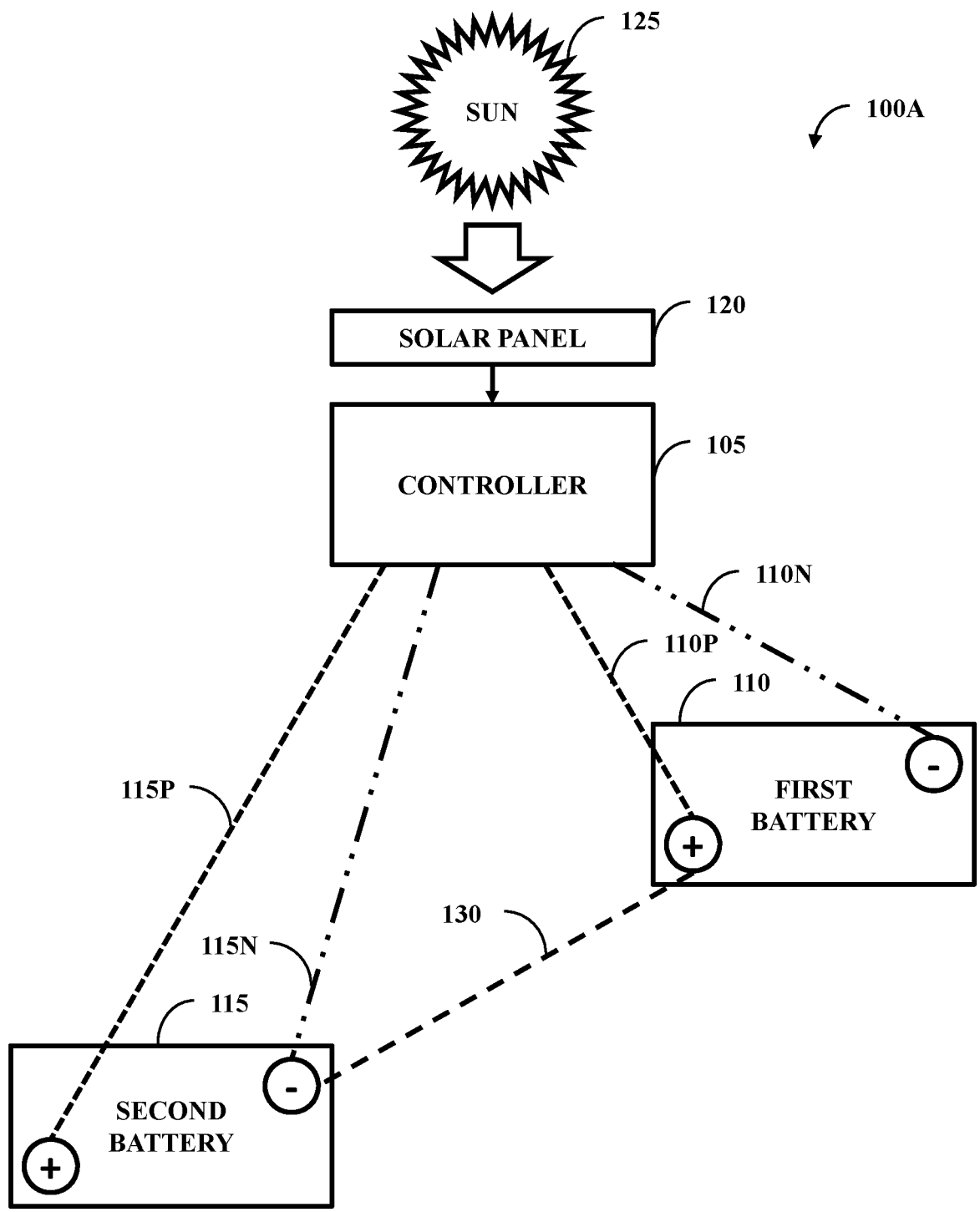
FIG. 1A illustrates one embodiment of an environment with a controller, a first battery, a second battery, and a solar panel.

A system, such as a vehicle, can use multiple batteries connected together. In one example, two batteries can be connected in series and additional batteries can be placed in parallel to increase energy capacity. It can be beneficial for the batteries to be balanced, meaning that they have relatively the same voltage level (e.g., an equal voltage level within +/−a tolerance). Additionally, the batteries can have a desired voltage level. If the batteries become unbalanced and/or do not function at a desirable voltage level, then a charging mechanism can be employed to charge the battery/batteries to bring them to a desirable level and balance them with one another.

The following includes definitions of selected terms employed herein. The definitions include various examples. The examples are not intended to be limiting.

"One embodiment", "an embodiment", "one example", "an example", and so on, indicate that the embodiment(s) or example(s) can include a particular feature, structure, characteristic, property, or element, but that not every embodiment or example necessarily includes that particular feature, structure, characteristic, property, or element. Furthermore, repeated use of the phrase "in one embodiment" may or may not refer to the same embodiment.

"Computer-readable medium", as used herein, refers to a medium that stores signals, instructions and/or data. Examples of a computer-readable medium include, but are not limited to, non-volatile media and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, other optical medium, a Random Access Memory (RAM), a Read-Only Memory (ROM), a memory chip or card, a memory stick, and other media from which a computer, a processor or other electronic device can read. In one embodiment, the computer-readable medium is a non-transitory computer-readable medium.

"Component", as used herein, includes but is not limited to hardware, firmware, software stored on a computer-readable medium or in execution on a machine, and/or combinations of each to perform a function(s) or an action (s), and/or to cause a function or action from another component, method, and/or system. Component may include a software controlled microprocessor, a discrete component, an analog circuit, a digital circuit, a programmed logic device, a memory device containing instructions, and so on. Where multiple components are described, it may be possible to incorporate the multiple components into one physical component or conversely, where a single component is described, it may be possible to distribute that single component between multiple components.

"Software", as used herein, includes but is not limited to, one or more executable instructions stored on a computer-readable medium that cause a computer, processor, or other electronic device to perform functions, actions and/or behave in a desired manner. The instructions may be embodied in various forms including routines, algorithms, modules, methods, threads, and/or programs, including separate applications or code from dynamically linked libraries.

FIG. 1A illustrates one embodiment of an environment 100A comprising a controller 105, a first battery 110, a second battery 115, and a solar panel 120. The solar panel 120 can collect energy by way of the sun 125. The controller 105 can manage charging of the first battery 110 and second battery 115 through use of solar panel collected energy. While depicted as managing solar panel collected energy, one of ordinary skill in the art will appreciate the controller 105 can manage charging of the first battery 110 and second battery 115 through use of other energy (e.g., gasoline-based energy, electrical outlet energy, nuclear energy, etc.).

The first battery 110 and the second battery 115 can be connected in series and connect to the controller 105. One or more batteries can be placed in parallel with the first and second batteries 110 and 115 to increase energy capacity without changing series voltages. In one embodiment, the controller 105 has four connectors—a first battery positive connection 110P to a positive terminal of the first battery 110, a first battery negative connection 110N to a negative terminal of the first battery 110, a second battery positive connection 115P to a positive terminal of the second battery 115, and a second battery negative connection 115N to a negative terminal of the second battery 115. The controller 105 can use these connectors to charge the batteries 110 and 115. In one example, to charge the first battery 110, the controller 105 can employ the connectors 110P and 110N.

While four connectors are illustrated, different configurations can be practiced. In one example, the environment 100 can employ three connectors—110N, 110P, and 115P. The first battery and second battery can be connected in series by way of a wire 130. Being connected in series can allow the batteries 110 and 115 to function as a single battery of double voltage; for example, if the batteries 110 and 115 are 12 volts, then they can function as a 24 volt (V) battery. Since the wire 130 connects the batteries 110 and 115 in series, the controller 105 can leverage the wire 130. With this, when powering the second battery 115, the controller 105 can connect to the positive terminal by connector 115P and to the negative terminal by connector 110P by way of the wire 130. The three connector configuration with the controller 105 can allow for various features, such as a floating neutral and less wiring/hardware.

While illustrated with two batteries and connected in series, the controller 105 can function in a variety of alignments. The controller 105 can connect to a battery bank comprising two or more batteries (e.g., the first battery 110 and the second battery 115). The battery bank can be a battery bank for a vehicle (e.g., automobile, airplane, boat, motorcycle, truck, trailered equipment, etc.). The solar panel 120 can be coupled to the vehicle and energy from the solar panel 120 can charge batteries of the battery bank. The battery bank can have multiple batteries with different configurations, such as some batteries being arranged in series and others in parallel. The controller 105 can manage charging of the battery bank.

Figure 1B:
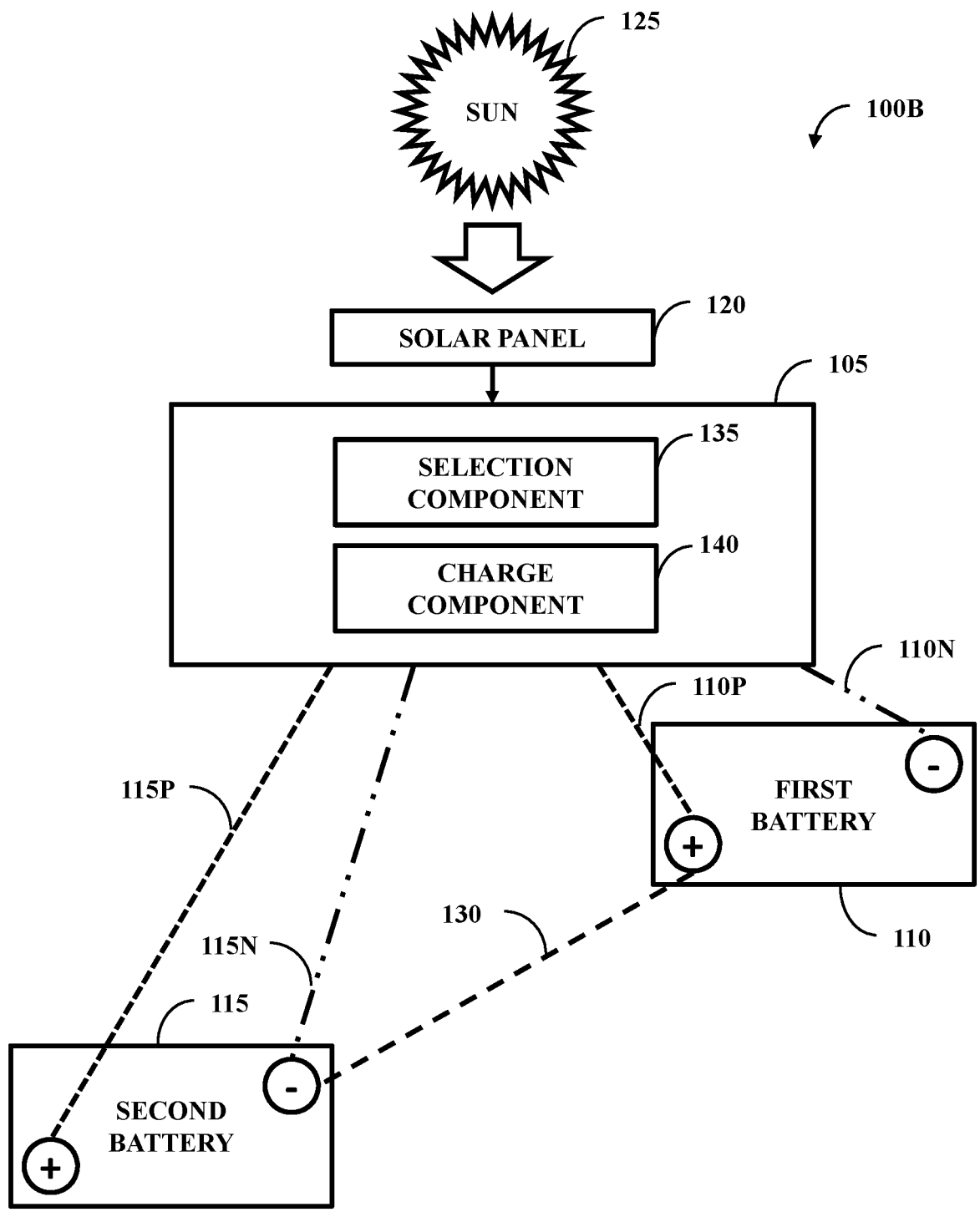
FIG. 1B illustrates one embodiment of an environment with a controller comprising a selection component and a charge component.

FIG. 1B illustrates one embodiment of an environment 100B with the controller 105 comprising a selection component 135 and a charge component 140. The selection component 135 can make a selection of a first battery to charge from the battery bank (e.g., the first battery 110) and a second battery not to charge (e.g., the second battery 115) from the battery bank. In one example, the selection component can select to charge the first battery 110 and not the second battery 115. The charge component 140 can cause the first battery 110 to be charged while the second battery 115 is not charged when the selection is made (e.g., in response to the selection component 135 making the selection and communicating the selection to the charge component 140).

The selection can be based on a variety of factors. In one embodiment, the selection component 135 makes the selection based, at least in part, on a charge level of the first battery 110 and a charge level of the second battery 115. As discussed, the batteries 110 and 115 can be 12V. In one example, the first battery 110 and second battery 115 can be drawn down to about 0V each. The selection component 135 can include internal logic to, by default, cause a charge the first battery 110 first in time. The charge component 140 can cause the first battery to charge. The controller 105 can employ an observation component to measure the charge level of the first battery 110. When the first battery 110 reaches a first battery set point (e.g., 12V), the controller 105 can switch to charging the second battery 115 until the second battery 115 reaches a second battery set point (e.g. same as the first battery set point). When the second battery 115 reaches the second battery set point, the controller 105 can determine if the first battery 110 needs further charge to re-reach the first battery set point. If the first battery 110 does need further charge, then the controller 105 can facilitate the further charge. If the first battery 110 does not need further charge (e.g., the first battery 110 is at the first battery set point or is within a set percentage of the first battery set point), then an alternative action can occur (e.g., the solar panel 120 can be shut off or energy of the solar panel 120 can be redirected, such as to power a fan to cool an interior cabin). The controller 105 can continue to monitor the batteries 110 and 115 and if the set points drop below a floor value, then the alternative action can be stopped/reversed and the appropriate battery can be charged.

In one embodiment, the selection component 135 makes the selection based, at least in part, on a charge length of time for the second battery 115 preceding the selection being made. The controller 105 can comprise a tracker component configured to time a charge length of time charges the charge component 140 charges a particular battery. In one example, the controller 105 can comprise logic to time a battery for a set amount of time (e.g., x number of minutes, with x being an integer). The charge component 140 can charge the first battery 110 for the set amount of time and when that time ends, the charge component 140 can charge the second battery 115 for the set amount of time or different amount of time. The charge component 140 can alternate charging between the first battery 110 and second battery 115 until the batteries 110 and 115 are fully charged. The tracker component can function with the observation component to prevent overcharging of the batteries 110 and 115. When batteries of the battery bank are fully charged, as a way of preventing overcharging, the controller 105 can function with the alternative activity and continue monitoring.

In one embodiment, the selection component 135 makes the selection based, at least in part, to achieve balance between the first battery 110 and the second battery 115 within a tolerance. A goal can be to have the batteries 110 and 115 balanced such they have the same charge level within the tolerance (e.g., a percentage value or a voltage value). In one example, with the tolerance being 1V, the first battery and second battery are at 0V. The charge component 140 charges the first battery 110 until it reaches 1V. The charge component 140 switches to charge the second battery 115 until it reaches 2V. The charge component 140 returns to the first battery 110 until it reaches 3V, and so alternatives until the batteries of the battery bank are charged.

While two series batteries in the battery bank are discussed, the battery bank can have a number different from two. In one example, the battery bank comprises the first battery 110, the second battery 115, and a third battery. The selection component 135 can be configured to make the selection from a first option for the first battery to charge and a second option for the second battery to charge. The selection component 135 can also select a third option for the third battery to charge. Selection of the first option can cause the second battery 115 and the third battery not to charge. With multiple options being available, the selection component 135 can intelligently select (e.g., through implementation of an artificial intelligence technique) which option to employ, such as weighing time against balance to select an option.

Figure 1C:
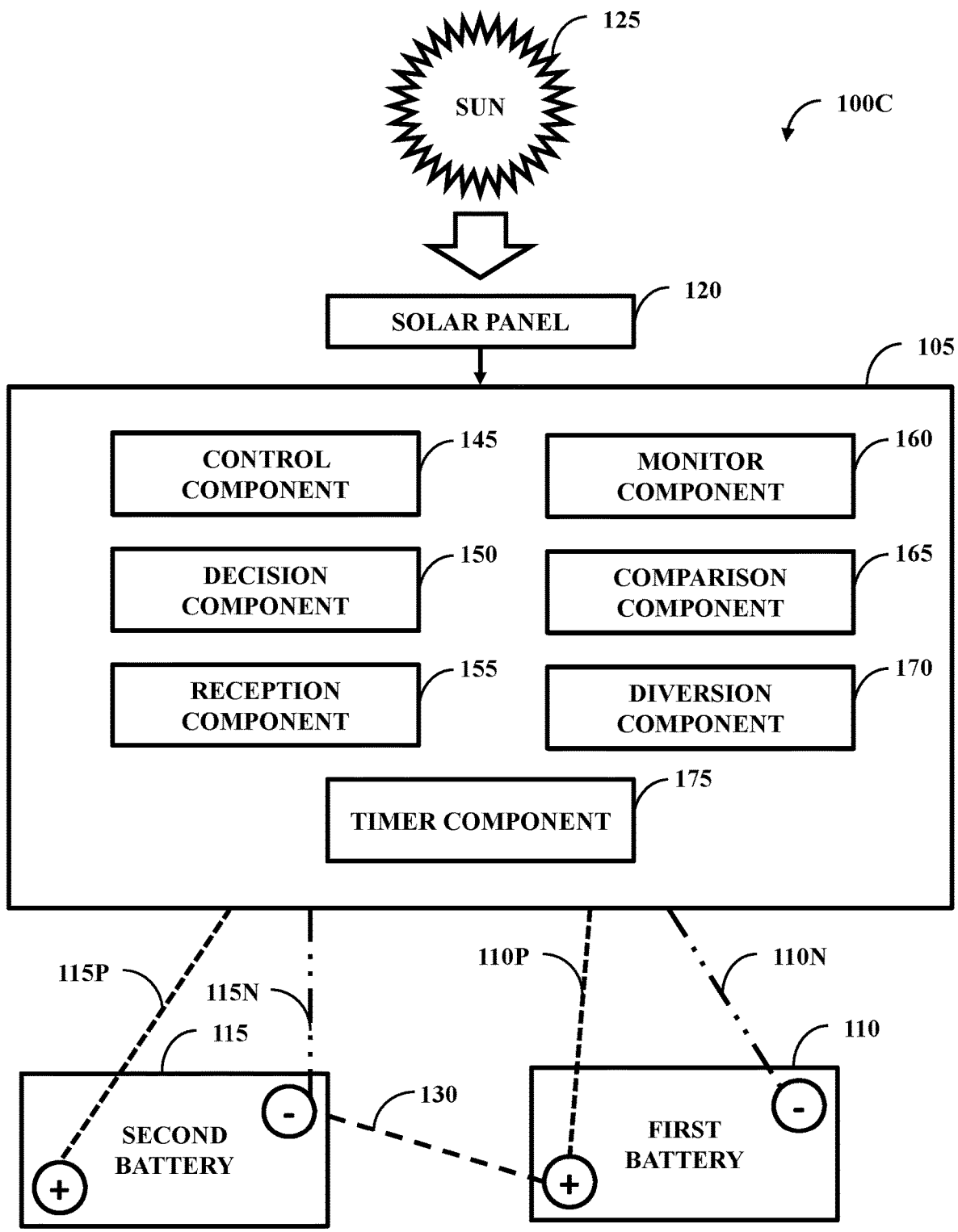
FIG. 1C illustrates one embodiment of an environment with a controller comprising a control component, a decision component, a reception component, a monitor component, a comparison component, a diversion component, and a timer component.

FIG. 1C illustrates one embodiment of an environment 100C with the controller 105 comprising a control component 145, a decision component 150, a reception component 155, a monitor component 160, a comparison component 165, a diversion component 170, and a timer component 175. The control component 145 can be configured to control the first battery 110 to be charged while the second battery 115 is not charged and configured to control the second battery 115 to be charged while the first battery 110 is not charged. The decision component 150 can be configured to make a first decision on when to control the first battery 110 to be charged while the second battery 115 is not charged. When the decision component 150 makes the first decision, then the control component 145 can control the first battery 110 to be charged. The decision component 150 can also be configured to make a second decision on when to control the second battery 115 to be charged while the first battery 110 is not charged. When the decision component 150 makes the second decision, then the control component 145 can control the second battery 115 to be charged. The decision component 150 can also be configured to make a third decision on when to control the first battery to not be charged and the second battery to not be charged. When this occurs, the controller 105 can shut off the solar panel 120 so the solar panel no longer receives energy or redirects the energy to a non-battery purpose (e.g., to power an interior light of the vehicle).

The reception component 155 can be configured to receive an energy from the solar panel 120. The energy from the solar panel 120 can charge the first battery 110 when the first decision is made. Similarly, the energy from the solar panel 120 can charge the second battery 115 when the second decision is made.

The monitor component 160 can be configured to monitor a charge level of the first battery 110 and configured to monitor a charge level of the second battery 115. The comparison component 165 can be configured to compare the charge level of the first battery 110 against a first threshold to produce a first comparison result and the charge level of the second battery 115 against a second threshold to produce a second comparison result. The decision component 150 can base the first decision, at least in part, on the first comparison result and base the second decision, at least in part, on the second comparison result.

With this, the monitor component 160 can monitor how charging occurs and based on a result of the charging, the decision component 150 can decide how charging should occur. In one example, the first threshold and the second threshold can be the same—a top voltage value (e.g., 14V). The control component 145 charges the first battery 110 until the first battery reaches the top voltage value. When that occurs, the monitor component 160 can report current voltage levels of other batteries, such as the second battery 115 and a third battery, to the comparison component 165. The comparison component 165 can compare these current voltage levels to determine which battery is furthest from the top voltage value—the furthest battery is then charged with a logic to break ties.

In one embodiment, the decision component 150 is configured to make a third decision on when to control the first battery 110 to not be charged and the second battery 115 to not be charged (and any other batteries not to be charged). When no batteries are to be charged (e.g., all batteries are at the top voltage value or higher), the decision component 150 can make a decision to shut off the solar panel 120 or cause the diversion component 170 to redirect the energy to a non-battery location, such as to power a light. The monitor component 160 can continue to monitor the battery bank and the comparison component 165 can be used to determine when a battery becomes too low (e.g., drops below the top voltage value). When the battery becomes too low, the solar panel 120 can be turned back on or the energy can stop being redirected and the controller 105 can cause the battery to be charged.

In one embodiment, the timer component 175 can track a time on how long a selected battery is charged. When the control component 145 starts charging the first battery 110, the timer component 175 can start timing. In one example, when a pre-defined time is reached, the timer component 175 can send a notice to the decision component 150. The decision component 150, in response to receiving and processing the notice, can instruct the control component 145 to stop charging the first battery 110 (e.g., a start charging the second batter 115).

Figure 1D:
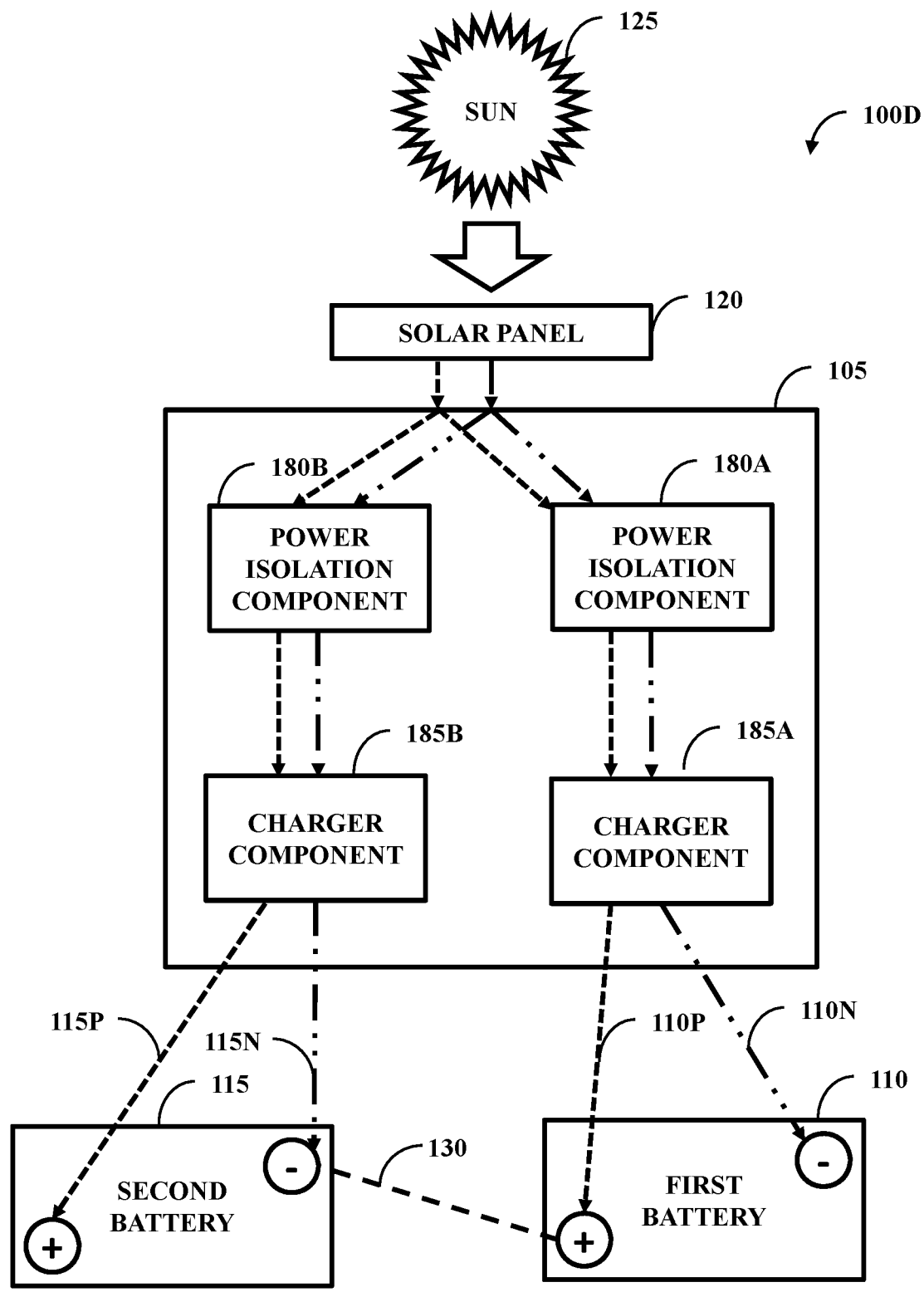
FIG. 1D illustrates one embodiment of an environment with a controller comprising two power isolation components and two charger components.

FIG. 1D illustrates one embodiment of an environment 100D with the controller 105 comprising a two power isolation components 180A and 180B and two charger components 185A and 185B (e.g., implemented as the charge component 140). The power isolation components 180 (e.g., functioning as individual receiver components) can implement as circuits that receive power from the solar panel 120 and maintain a high (e.g., maximum) power point of the panel while converting the voltage to an isolated voltage independent of the solar panel voltage. This can be performed by an isolated direct current (DC) to DC converter (e.g., a conversion component). After isolation, the charger components 185 can charger the respective batteries.

Figure 1E:
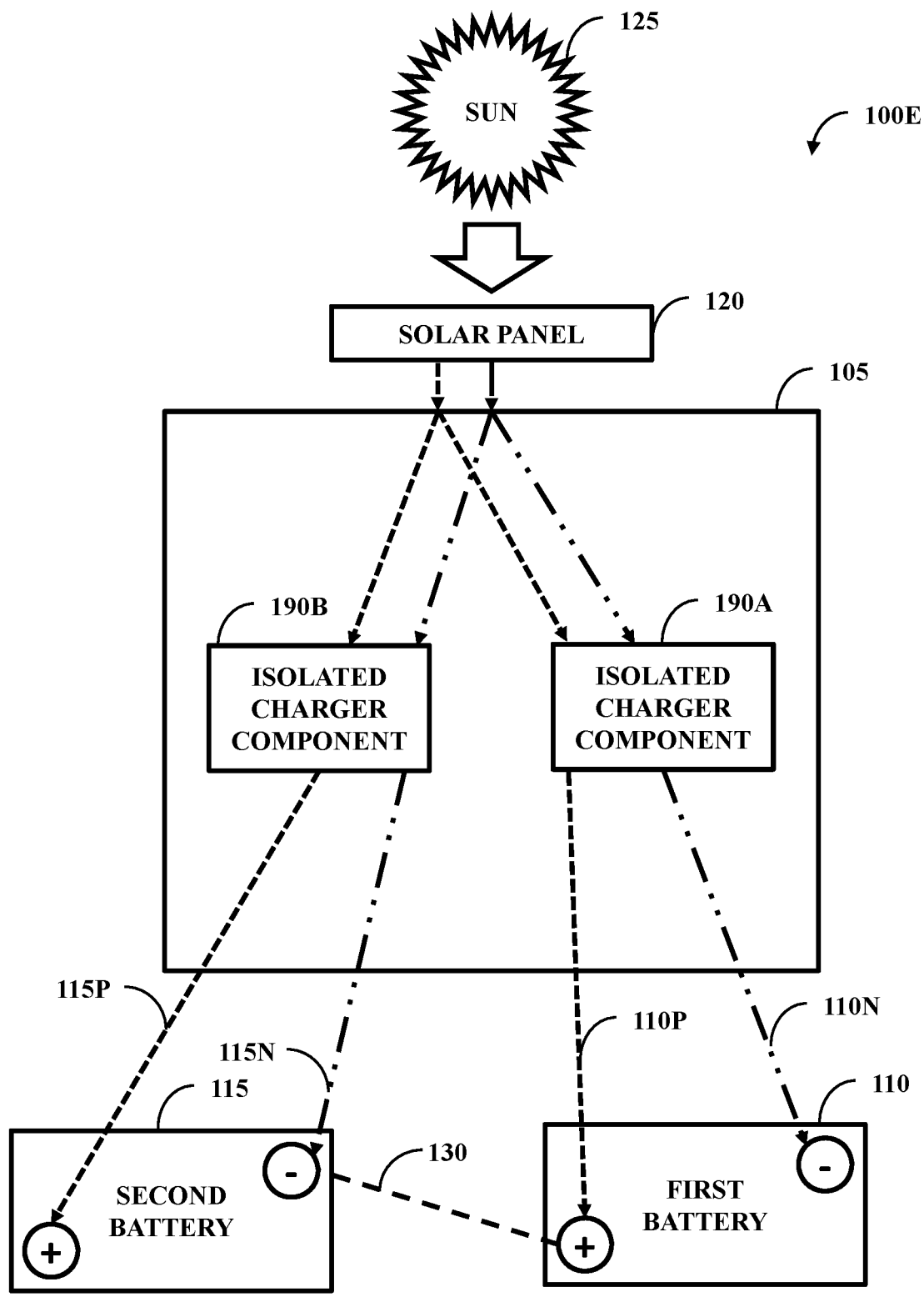
FIG. 1E illustrates one embodiment of an environment with a controller comprising two isolated charger components.

FIG. 1E illustrates one embodiment of an environment 100E with the controller 105 comprising two isolated charger components 190A and 190B. The isolated charger components 190 can be battery chargers with isolated outputs (e.g., flyback chargers). The controller 105 of the environment 100E can charge the first battery 110 and the second battery 115 independently based off battery-specific requirements. In one example, the isolated charger component 190A can be a first control component configured to control the first battery 110 to be charged while the second battery 115 is not charged or is charged. Similarly, the isolated charger component 190B can be a second control component configured to control the second battery 115 to be charged while the first battery 110 is not charged or is charged.

Figure 2:
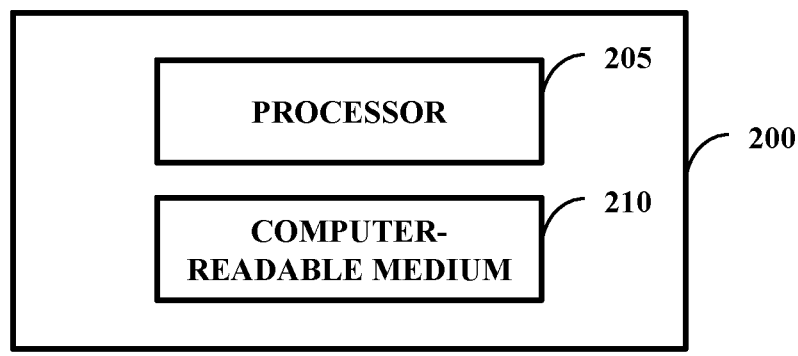
FIG. 2 illustrates one embodiment of a system comprising a processor and a computer-readable medium.

FIG. 2 illustrates one embodiment of a system 200 comprising a processor 210 (e.g., a general purpose processor or a processor specifically designed for performing a functionality disclosed herein) and a computer-readable medium 220 (e.g., non-transitory computer-readable medium). The processor 210 and computer-readable medium 220 can be part of the controller 105 of FIG. 1. In one embodiment, the computer-readable medium 220 is communicatively coupled to the processor 210 and stores a command set executable by the processor 210 to facilitate operation of at least one component disclosed herein (e.g., the observation component or the selection component of FIG. 1B). In one embodiment, at least one component disclosed herein (e.g., the tracker component or the decision component 150 of FIG. 1C) can be implemented, at least in part, by way of non-software, such as implemented as hardware by way of the system 200. In one embodiment, the computer-readable medium 220 is configured to store processor-executable instructions that when executed by the processor 210, cause the processor 210 to perform a method disclosed herein (e.g., the methods 300-700 addressed below).

Figure 3:
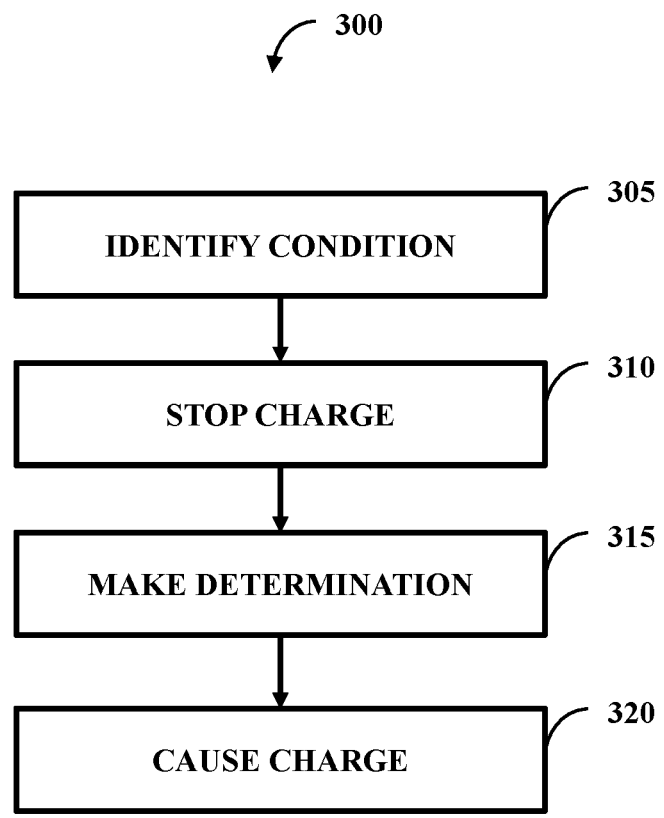
FIG. 3 illustrates one embodiment of a method comprising four actions.

FIG. 3 illustrates one embodiment of a method 300 comprising four actions 305-320. At 305, there is identifying a condition to stop charging the first battery 110 of FIG. 1A. Example conditions can be time-based or charge level-based (e.g., voltage number reached or too great of an imbalance). At 310, in response to identifying the condition to stop charging the first battery 110 of FIG. 1A, stopping the charge of the first battery 110 of FIG. 1A can occur. At 315, a determination is made on if the second battery 115 should be charged when the first battery 110 is no longer charged. When the determination is that the second battery 115 of FIG. 1A should be charged when the first battery 110 of FIG. 1A is no longer charged, the second battery 115 of FIG. 1A is caused to be charged at 320.

Figure 4:
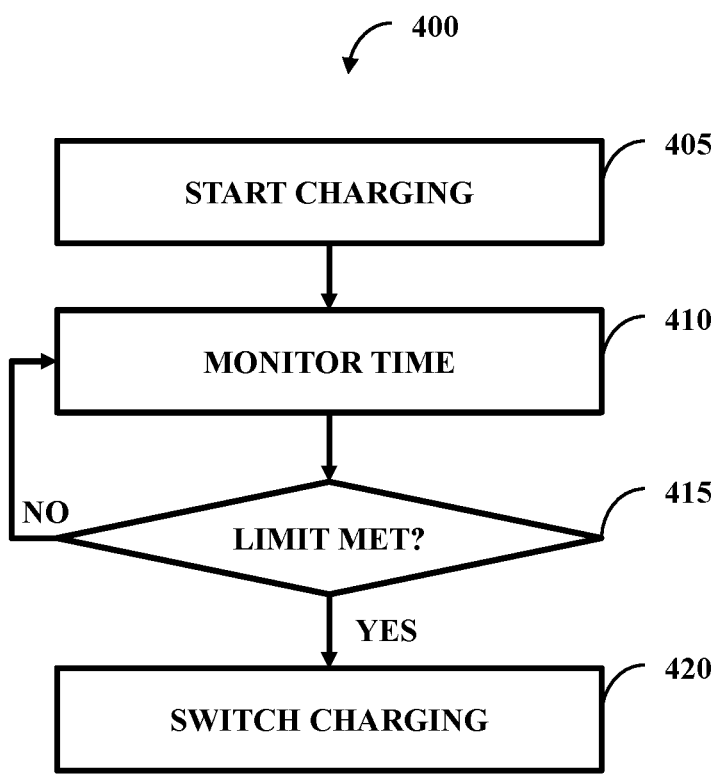
FIG. 4 illustrates one embodiment of a method comprising four actions.

FIG. 4 illustrates one embodiment of a method 400 comprising four actions 405-420. At 405, charging starts of the first battery 110 of FIG. 1A and at 410, a time of this charging is monitored. A check can occur at 415 on if a time limit is met. If the time limit is met, then the charging can be switched at 420 (e.g., charging is switched to the second battery 115 of FIG. 1A). If the time limit is not met, then monitoring can continue at 410.

Figure 5:
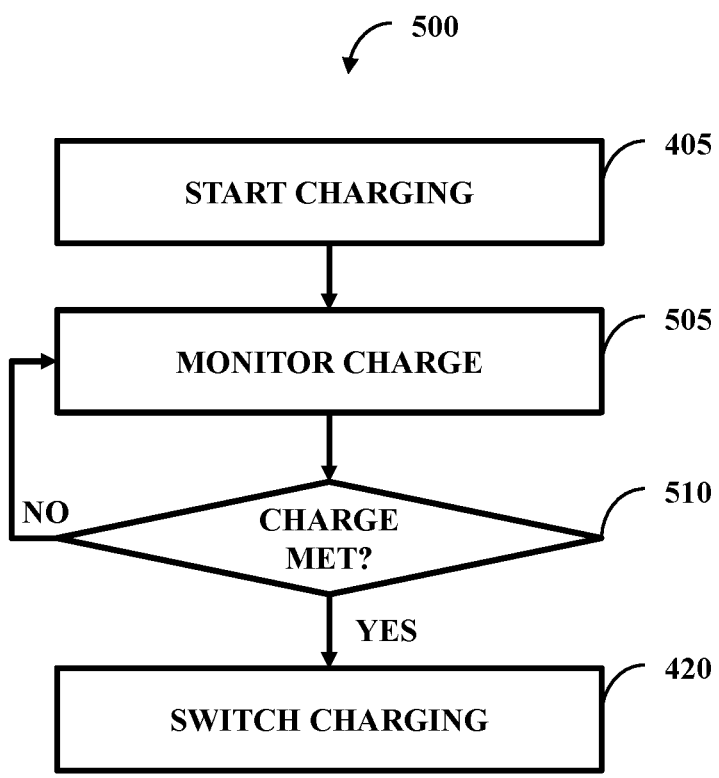
FIG. 5 illustrates one embodiment of a method comprising four actions.

FIG. 5 illustrates one embodiment of a method 500 comprising four actions 405, 420, and 505-510. At 405, charging starts of the first battery 110 of FIG. 1A and at 505, a charge level of the first battery 110 of FIG. 1A is monitored. A check can occur at 510 on if a charge limit is met. If the charge limit is met, then the charging can be switched at 420 (e.g., charging is switched to the second battery 115 of FIG. 1A). If the charge limit is not met, then monitoring can continue at 505.

In one embodiment, aspects of the methods 400 of FIGS. 4 and 500 can be combined. In one example the check 510 and check 415 of FIG. 4 can run concurrently. If either the time limit is met or the charge limit is met, then charging can stop or be switched. In one example, there is no purpose to charge a battery that is fully charged even if time has not expired.

Figure 6:
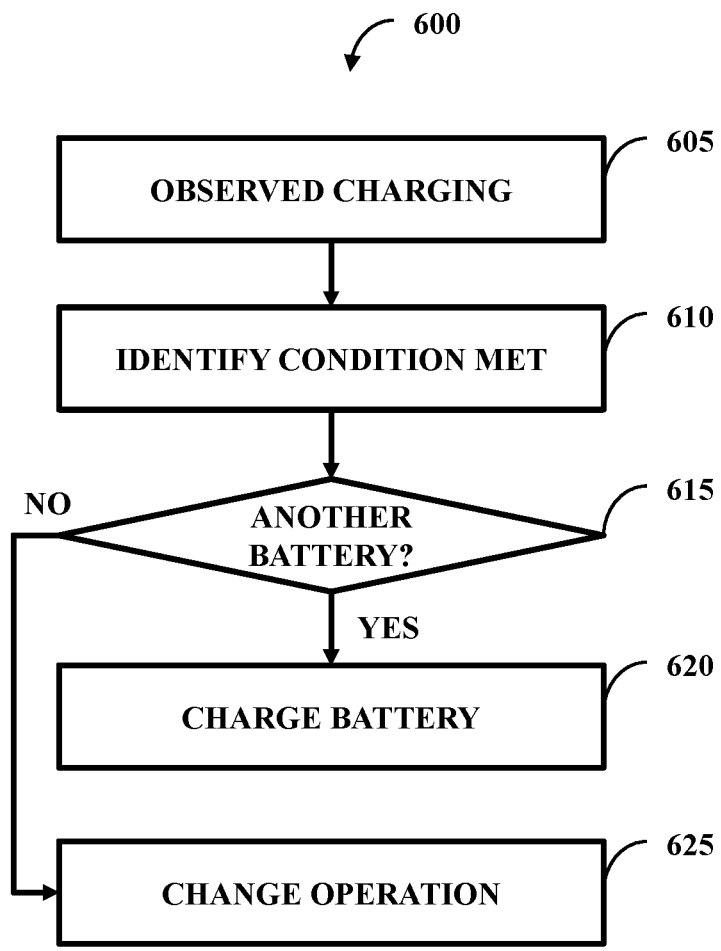
FIG. 6 illustrates one embodiment of a method comprising five actions.

FIG. 6 illustrates one embodiment of a method 600 comprising five actions 605-625. The second battery 115 of FIG. 1A can be charged this charging can be observed at 605 (e.g., a combination of actions 410 of FIG. 4 and 505 of FIG. 5). At 610, identifying, after causing the second battery to be charged (e.g., at least partially), a condition to stop charging the second battery 115 of FIG. 1A can take place in view of what is observed. A check can occur at 615 to determine if another battery should be charged—as part of this check 615 there can be stopping the charge of the second battery 115 of FIG. 1A in response to identifying the condition to stop charging the second battery 115 of FIG. 1A. Also at 615, a determination can be made on if the first battery 110 of FIG. 1A should be charged when the second battery 115 of FIG. 1A is no longer charged.

If the check 615 results in the determination being that the first battery 110 of FIG. 1A should be charged when the second battery 115 of FIG. 1A is no longer charged, then the method 600 can continue to 620 where the first battery 110 of FIG. 1A is charged. This feature can loop and in turn return to action 605. As the first battery 110 of FIG. 1A becomes charged, action 610 and check 615 can occur and it can be determined that the second battery 115 of FIG. 1 should be charged again.

If the check 615 results in the determination being that the first battery 110 of FIG. 1A should not be charged, or any other battery, then operation can change at 625. An example change of operation can be causing a non-battery to be powered if the determination is that the second battery 115 of FIG. 1A should not be charged (and the first battery 110 of FIG. 1A should not be charged as well as any other battery). After the change of operation, the batteries of the battery bank can be monitored and if a battery drops below an acceptable level, then that battery can be charged with that charging being observed at 605.

Figure 7:
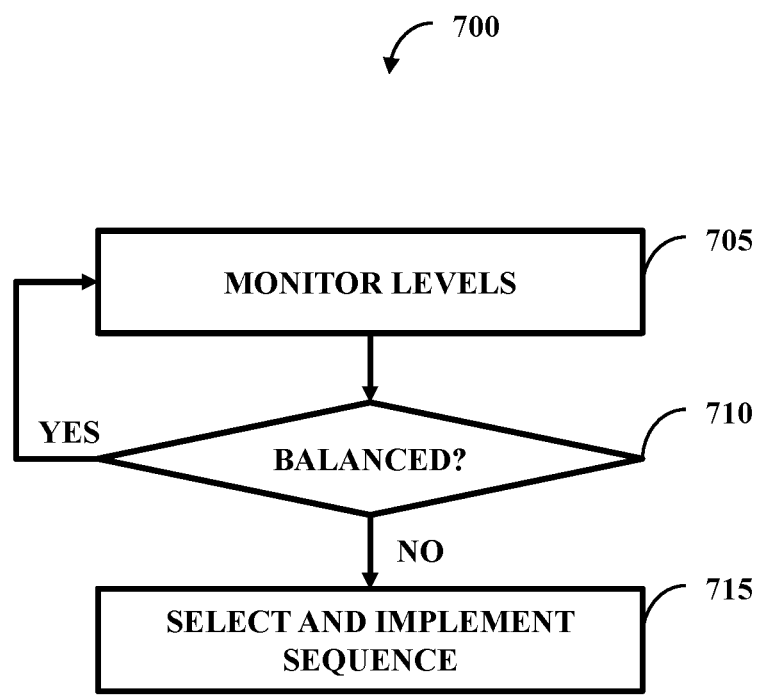
FIG. 7 illustrates one embodiment of a method comprising three actions.

FIG. 7 illustrates one embodiment of a method 700 comprising three actions 705-715. At 705, battery voltage levels can be monitored. At 710, a check is performed to determine if the first battery 110 of FIG. 1A is balanced with the second battery 115 of FIG. 1A and vice versa (or if more than two batteries, if batteries are in balance with one another). If the batteries 110-115 of FIG. 1A are balanced, then the monitoring can continue at 705. If the batteries 110-115 of FIG. 1A are not balanced, then at 715 a sequence can be selected and implemented to bring the batteries 110-115 of FIG. 1A into balance.

While the methods disclosed herein are shown and described as a series of blocks, it is to be appreciated by one of ordinary skill in the art that the methods are not restricted by the order of the blocks, as some blocks can take place in different orders. Similarly, a block can operate concurrently with at least one other block.

What is claimed is:

1. A controller configured to be connected to a first battery and a second battery, the controller comprising:
   a first control component configured to control the first battery to be charged while the second battery is not charged;
   a second control component configured to control the second battery to be charged while the first battery is not charged;

a first decision component configured to make a first decision on when to control the first battery to be charged while the second battery is not charged;

a second decision component configured to make a second decision on when to control the second battery to be charged while the first battery is not charged; and a timer component configured to track a time on how long a selected battery is charged, where the first decision component makes the first decision based, at least in part, on the time, where when the first decision component makes the first decision, the first control component operates, where the second decision component makes the second decision based, at least in part, on the time, and where when the second decision component makes the second decision, the second control component operates.

2. The controller of claim 1, comprising:

a first monitor component configured to monitor a charge level of the first battery; and a second monitor component configured to monitor a charge level of the second battery, where the first decision component is configured to make the first decision based, at least in part, on the charge level of the first battery and where the second decision component is configured to make the second decision based, at least in part, on the charge level of the second battery.

3. The controller of claim 1, where the first control component is configured to control the first battery to be charged by way of a connection to an electrical outlet and where the second control component is configured to control the second battery to be charged by way of the connection to the electrical outlet.

4. The controller of claim 1, where the first control component is configured to control the first battery to be charged by way of a connection to a gasoline-based energy source and where the second control component is configured to control the second battery to be charged by way of the connection to the gasoline-based energy source.

5. The controller of claim 1, where the first control component is configured to control the first battery to be charged by way of a solar panel of a vehicle, where the second control component configured to control the second battery to be charged by way of the solar panel of the vehicle, and where the vehicle retains the first control component, the second control component, the first decision component, the second decision component, and the timer component.

6. The controller of claim 1, comprising:

a reception component configured to receive an energy from a solar panel;

a third decision component configured to make a third decision on when to control the first battery to not be charged and the second battery to not be charged; and a diversion component configured to divert the energy from the solar panel to a non-battery location when the third decision is made, where the energy from the solar panel charges the first battery when the first decision is made.

\* \* \* \* \*